(12) United States Patent
Lozhkin

(10) Patent No.: US 8,686,791 B2
(45) Date of Patent: Apr. 1, 2014

(54) AMPLIFYING APPARATUS AND DISTORTION COMPENSATION METHOD

(75) Inventor: Alexander N Lozhkin, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 198 days.

(21) Appl. No.: 13/305,672

(22) Filed: Nov. 28, 2011

(65) Prior Publication Data

US 2012/0154033 A1 Jun. 21, 2012

(30) Foreign Application Priority Data

Dec. 17, 2010 (JP) ................................ 2010-281564

(51) Int. Cl.
*H03F 3/68* (2006.01)
(52) U.S. Cl.
USPC ......... 330/124 R; 330/149; 330/295; 330/107
(58) Field of Classification Search
None
See application file for complete search history.

(56) References Cited

U.S. PATENT DOCUMENTS

| | | | |
|---|---|---|---|
| 6,452,446 B1 * | 9/2002 | Eisenberg et al. ............... | 330/52 |
| 6,552,608 B2 * | 4/2003 | Matsuda et al. ................. | 330/52 |
| 6,614,854 B1 * | 9/2003 | Chow et al. .................... | 375/297 |
| 6,949,976 B2 | 9/2005 | Funyu et al. | |
| 7,126,422 B2 * | 10/2006 | Suzuki et al. .................. | 330/151 |
| 8,170,507 B2 * | 5/2012 | Wang et al. .................. | 455/114.3 |
| 8,204,454 B2 * | 6/2012 | Yamaoka et al. ........... | 455/114.2 |
| 2012/0319772 A1 * | 12/2012 | Chang ........................ | 330/124 R |

FOREIGN PATENT DOCUMENTS

| | | |
|---|---|---|
| JP | 2000-22659 | 1/2000 |
| JP | 2006-140645 | 6/2006 |
| WO | WO-2004-034574 | 4/2004 |

OTHER PUBLICATIONS

Altera Corporation, "Digital Predistortion Reference Design", Jul. 1, 2003, pp. 1-46.
Hakala, Ilkka et al., "A 2.14-GHz Chireix Outphasing Transmitter", IEEE Transactions on Microwave Theory and Thchniques, vol. 53, No. 6 Jun. 1, 2005, pp. 2129-2138.
Qureshi, J. H. et al., "A 90-W Peak Power GaN Outphasing Amplifier With Optimum Input Signal Conditioning", IEEE Transactions on Microwave Theory and Techniques, vol. 57, No. 8, Aug. 1, 2009, pp. 1925-1935.
Paloma, Garcia et al., "An Adaptive Digital Method of Imbalances Cancellation in LINC Transmitters", IEEE Transactions on Vehicular Technology, vol. 54, No. 3, May 1, 2005 pp. 879-888.
Pascale, Jardin et al., "Filter Lookup Table Method for Power Amplifier Linearization", IEEE Transactions on Vehicular Technology, vol. 56, No. 3, May 1, 2007, pp. 1076-1087.
Edmund, W. C., et al., "A Mixed-Signal Approach Towards Linear and Efficient N-Way Doherty Amplifiers", IEEE Transactions on Microwave Theory and Techniques, vol. 55, No. 5, May 1, 2007. pp. 866-879.

* cited by examiner

*Primary Examiner* — Patricia Nguyen
(74) *Attorney, Agent, or Firm* — Fujitsu Patent Center

(57) ABSTRACT

An amplifying apparatus includes: a plurality of amplifiers; a linear combiner receiving a plurality of leakage signals resulting from cross leakage between outputs of the plurality of amplifiers and performing a linear combination of level values of the plurality of leakage signals to generate a plurality of linear combination signals; and an output calculator calculating real level values of a plurality of output amplified signals of the amplifiers from level values of the linear combination signals.

6 Claims, 8 Drawing Sheets

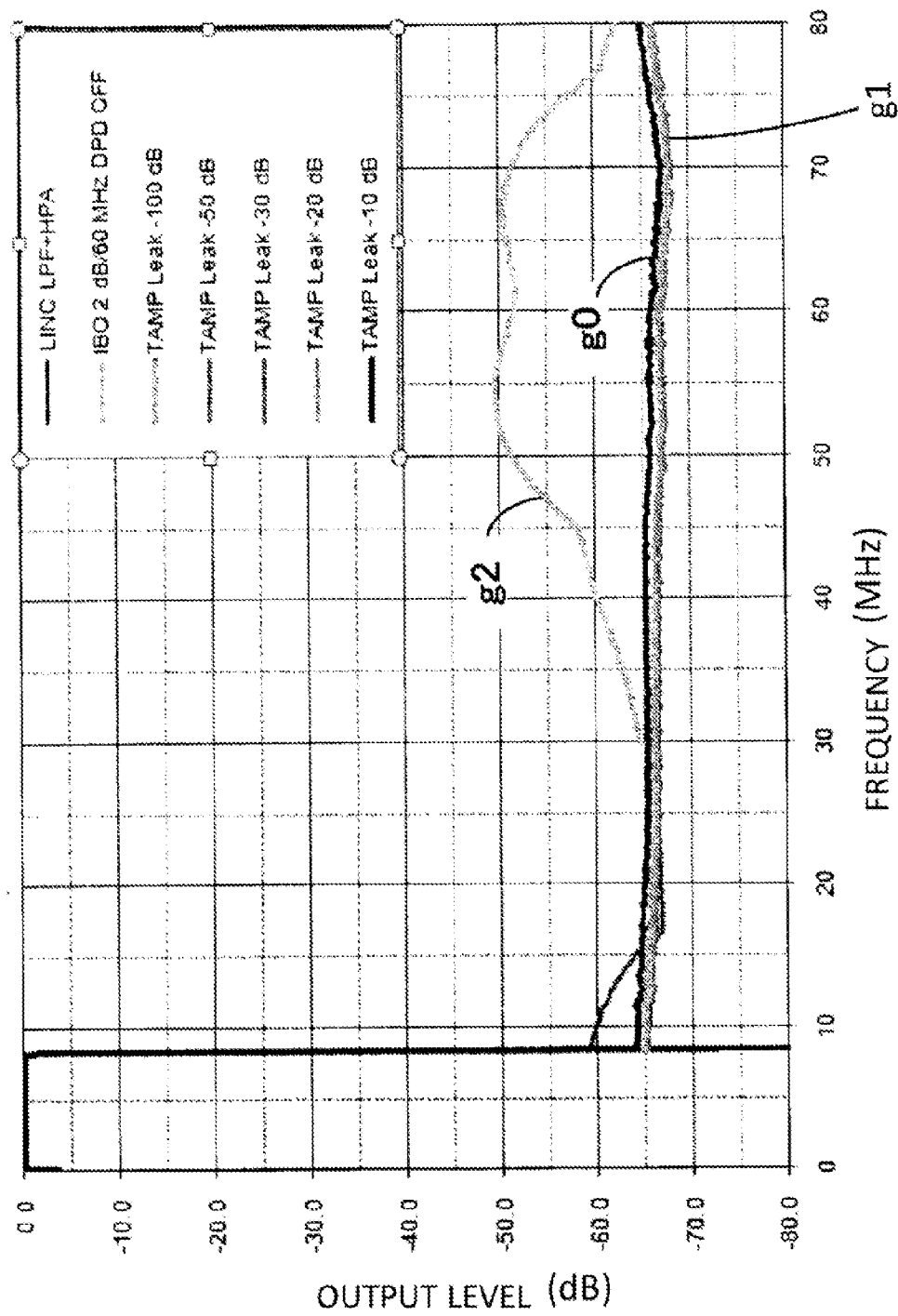

AMPLIFYING APPARATUS AND DISTORTION COMPENSATION METHOD

CROSS REFERENCE TO RELATED APPLICATION

This application is based upon and claims the benefit of priority from the prior Japanese Patent Application NO. 2010-281564 filed on Dec. 17, 2010, the entire contents of which are incorporated herein by reference.

FIELD

The embodiments disclosed hereafter are related to an amplifying apparatus amplifying a signal and a distortion compensation method for compensating for distortion of a signal.

BACKGROUND

As the demand for broadband service communications increases, wireless communication networks are decreasing in cost and increasing in speed. In these circumstances, high power amplifiers incorporated in base stations and mobile phones today are a key device for building future fast wireless communication networks, and increase of the efficiency of the high power amplifiers is demanded.

For example, OFDM (orthogonal Frequency Division Multiplexing) modulation used by WiMAX (Worldwide Interoperability for Microwave Access), which is next-generation wireless broadband technology, requests amplifiers that operate with high output power because of their high peak power.

When communication services as mentioned above are provided, it is important to enable high power amplifiers to operate with higher efficiency, that is, to enable high power amplifiers to output higher power level radio signals with lower power consumption.

Recently, composite high power amplifiers, which incorporate multiple high power amplifiers, have been developed. A composite high power amplifier designed to certain specifications generally has functionality, amplification capability and effectiveness superior to standard high power amplifiers. Composite high power amplifiers therefore are being widely used in wireless communication devices.

Existing techniques include: an OFDM modulator that eliminates nonlinear distortion, proposed in Japanese Laid-Open Patent Publication No. 2000-22659; a technique that changes distortion compensation data for AM-AM (amplitude-amplitude modulation) characteristics or AM-PM (amplitude-phase modulation) characteristics to reduce distortion component power, proposed in Japanese Laid-Open Patent Publication No. 2006-140645; a Doherty amplifier that incorporates N amplifiers, proposed in "A Mixed-Signal Approach Towards Linear and Efficient N-Way Doherty Amplifiers", IEEE TRANSLATIONS ON MICROWAVE THEORY AND TECHNIQUES, VOL. 55, MAY 2007; and a technique to minimize phase distortion of LINC (Linear amplification using nonlinear components) transmitters, proposed in "An Adaptive Digital Method of Imbalances Cancellation in LINC Transmitters", IEEE TRANSACTIONS ON VEHICULAR TECHNOLOGY, VOL. 54, NO. 3, MAY 2005.

High power amplifiers or composite high power amplifiers are sometimes caused to operate in a nonlinear region in order to achieve high efficiency. However, when they are operating in a nonlinear region, distortion is exacerbated. Therefore, predistortion, which is a type of distortion compensation, is performed during operation in a nonlinear region.

In a composite high power amplifier, which includes multiple amplifiers, cross leakage in which outputs from the individual amplifiers interfere with one another occurs.

No measures have been taken against cross leakage in conventional composite high power amplifiers and signals affected by cross leakage have been directly used for predistortion. Accordingly, the conventional composite high power amplifiers have a problem that distortion may not be accurately compensated for and efficient signal amplification may not be performed.

SUMMARY

According to embodiments disclosed hereinafter, there is provided an amplifying including: a plurality of amplifiers, a linear combiner receiving a plurality of leakage signals resulting from cross leakage between outputs of the plurality of amplifiers and performing a linear combination of level values of the plurality of leakage signals to generate a plurality of linear combination signal, and an output calculator calculating real level values of a plurality of output amplified signals of the amplifiers from level values of the linear combination signals.

The object and advantages of the embodiments will be realized and attained by means of the elements and combinations particularly pointed out in the claims.

It is to be understood that both the foregoing general description and the following detailed description are exemplary and explanatory and are not restrictive of the embodiments, as claimed.

BRIEF DESCRIPTION OF THE DRAWINGS

FIG. 8 is a graph of results of performance of digital predistortion.

DESCRIPTION OF EMBODIMENTS

Figure 1:
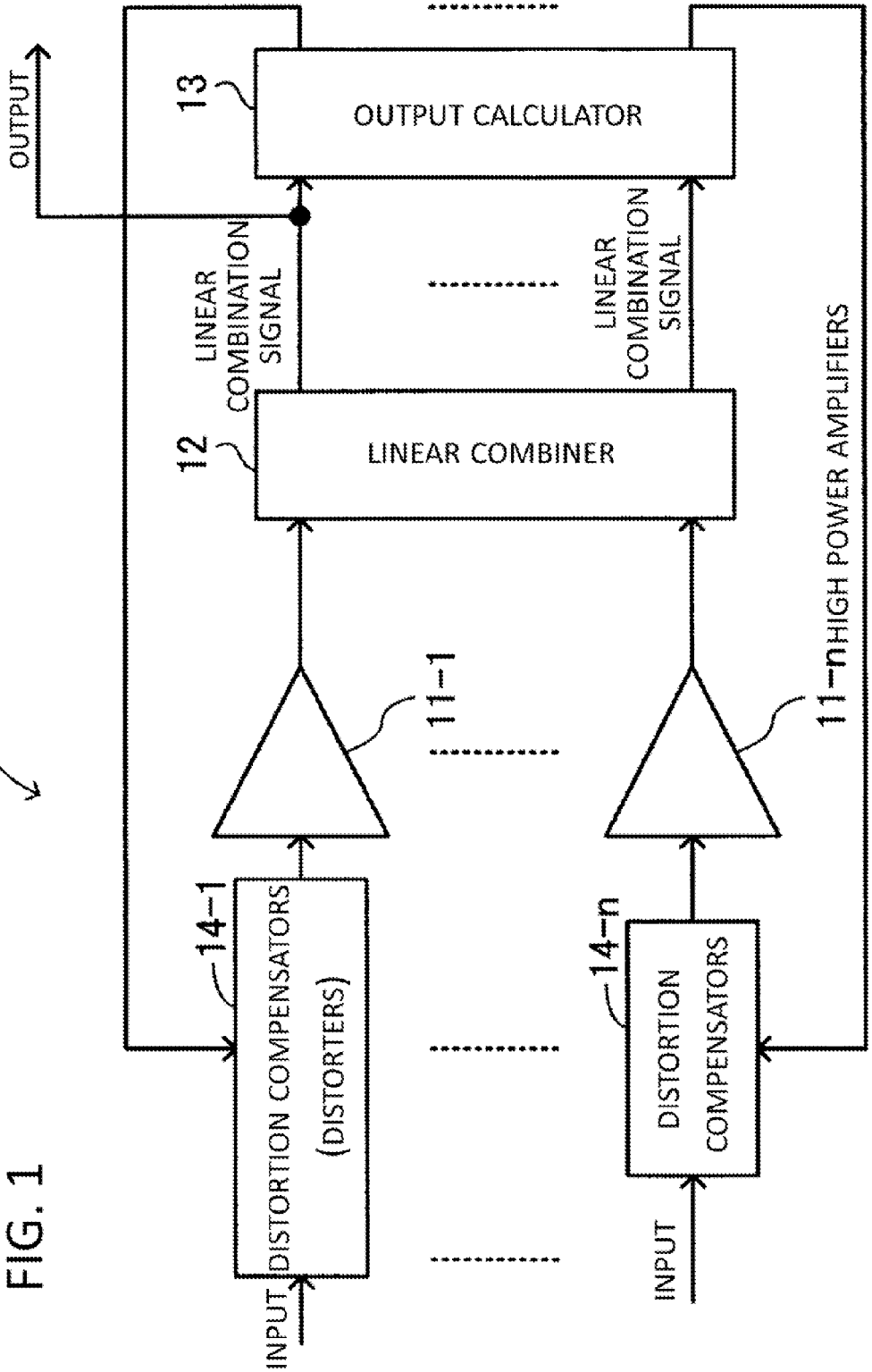
FIG. 1 is a diagram illustrating an exemplary configuration of an amplifying apparatus.

Embodiments of the present invention will be described below with reference to drawings. FIG. 1 illustrates an exemplary configuration of an amplifying apparatus. The amplifying apparatus 1 includes amplifiers 11-1 to 11-$n$, a linear combiner 12, an output calculator 13 and distortion compensators 14-1 to 14-$n$.

The amplifiers 11-1 to 11-$n$ may be high power amplifiers, for example, and are therefore hereinafter referred to as high power amplifiers 11-1 to 11-$n$. Since distortion compensation performed herein may be predistortion, for example, the distortion compensators 14-1 to 14-$n$ are referred to as predistorters 14-1 to 14-$n$.

The high power amplifiers 11-1 to 11-$n$ amplify predistorted input signals output from the predistorters 14-1 to 14-$n$.

The linear combiner 12 receives multiple leakage signals resulting from cross leakage between outputs of the high power amplifiers 11-1 to 11-n (the cross leakage will be described later).

Then a linear combination of the level values of the leakage signals is performed to generate multiple linear combination signals. The output calculator 13 calculates the real level values of amplified output signals of the high power amplifiers 11-1 to 11-n from the level values of the linear combination signals.

Each of the predistorters 14-1 to 14-n internally generates a compensation value that reduces the difference between the level value of the input signal of its associated high power amplifier 11-1 to 11-n and the real level value of the amplified output signal and superimposes the correction value on the input signal of the high power amplifier 11-1 to 11-n.

Predistortion will be described below. A high power amplifier is caused to operate in a nonlinear region in order to achieve high efficiency. In the nonlinear region, an amplified signal appears as distortion such as inter-modulation distortion (IMD), degrading distortion characteristics.

The efficiency of an amplifier is the ratio of output signal power to the sum of power supplied to the amplifier and the power of signal input into the amplifier. With higher efficiency, a signal of a higher level may be output with lower power consumption.

When distortion characteristics degrade, constellation points deviate from the ideal locations and the phase and amplitude of the signal also deviate to degrade the error vector magnitude (EVM) and the bit error rate (BER).

One known technique to compensate for such distortion is predistortion. The predistortion generates a correction signal (predistortion signal) which has characteristics that are the inverse of distortion of the amplifier to adjust the input signal, thereby cancelling the distortion of the output of the amplifier to compensate for the distortion and improve the linearity of the amplifier.

In the predistortion, typically a signal output from the high power amplifier is fed back, certain processing is applied to the signal and then a correction signal is generated. Generation of a correction signal by digital signal processing is called digital predistortion (DPD).

Figure 2:
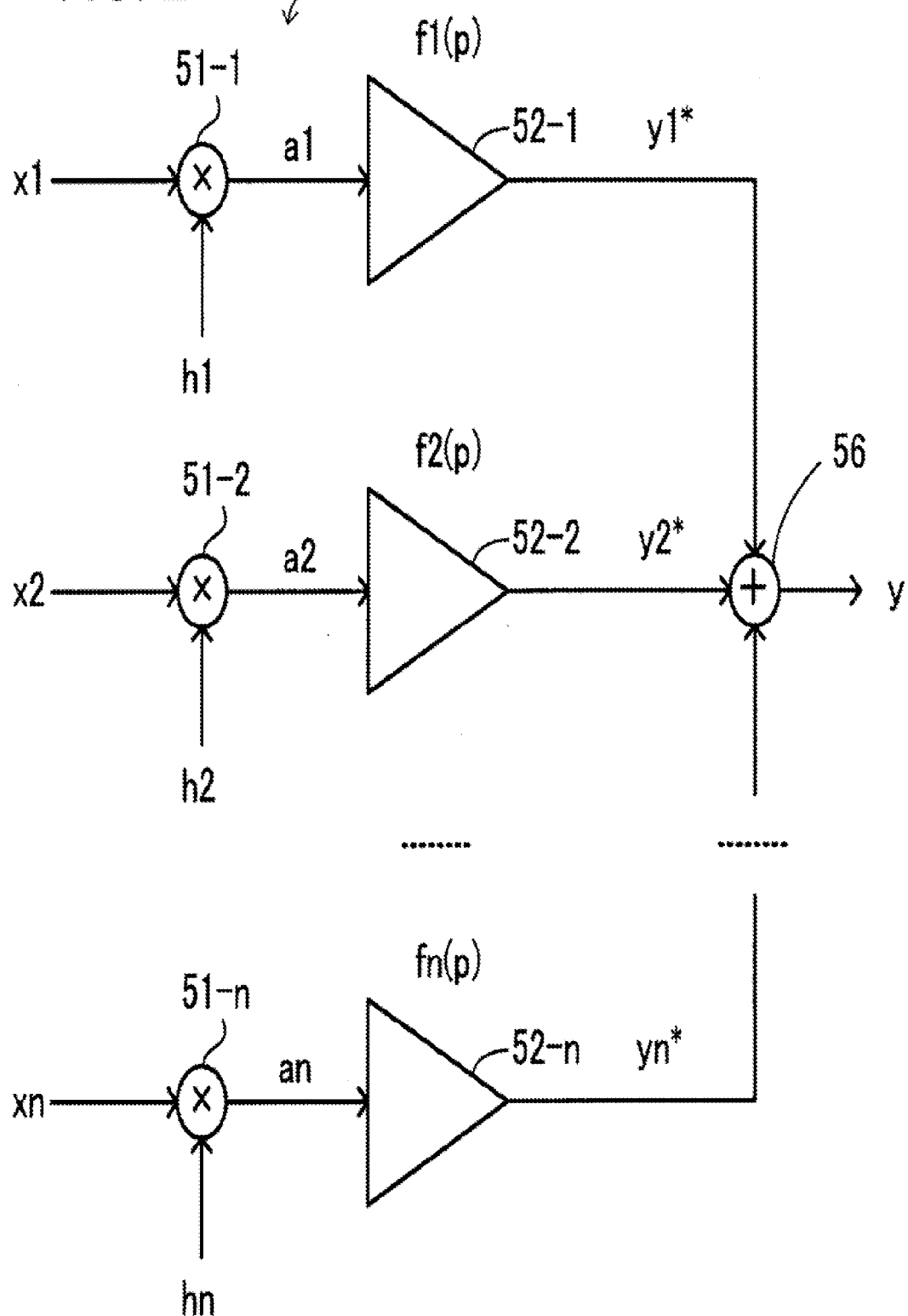
FIG. 2 is a diagram illustrating an exemplary configuration of a composite high power amplifying apparatus.

A configuration of a conventional composite high power amplifier will be described below. FIG. 2 illustrates an exemplary configuration of a conventional composite high power amplifier. The composite high power amplifier 50 includes multipliers 51-1 to 51-n, high power amplifiers 52-1 to 52-n, and an adder 56. It is assumed here that no cross leakage is occurring.

The multiplier 51-1 multiplies an input signal x1 by a correction signal h1 for predistortion for the high power amplifier 52-1 to generate a multiplication signal a1. The multiplier 51-2 multiples an input signal x2 by a correction signal h2 for predistortion for the high power amplifier 52-2 to generate a multiplication signal a2. Similarly, the multiplier 51-n multiples an input signal xn by a correction signal hn for predistortion for the high power amplifier 52-n to generate a multiplication signal an.

The high power amplifier 52-1 amplifies the multiplication signal a1 to generate an output signal y1* and the high power amplifier 52-2 amplifies the multiplication signal a2 to generate an output signal y2*. Similarly, the high power amplifier 52-n amplifies the multiplication signal an to generate an output signal yn*. The adder 56 adds the output signals y1*, y2*, . . . , yn* together to generate and output an ultimate output signal y.

To improve the linearity of an output of the composite high power amplifier 50, the high power amplifiers 52-1 to 52-n are individually linearized. To that end, the correction signals h1 to hn are superimposed on the input signals x1 to xn of the high power amplifiers 52-1 to 52-n, respectively, to individually accomplish predistortion.

The transfer functions for outputs to inputs of the high power amplifiers 52-1 to 52-n in their respective nonlinear regions are denoted by $f1(p), f2(p), \ldots, fn(p)$, respectively. When predistortion for the composite high power amplifier 50 is performed, it is difficult to generate correction signals h1 to hn appropriate to the transfer functions $f1(p)$ to $fn(p)$ of the respective higher power amplifiers 52-1 to 52-n by analyzing only the single output signal y. Therefore, the values of the output signals y1* to yn* of the high power amplifiers 52-1 to 52-n are used to calculate the correction signals h1 to hn.

Figure 3:
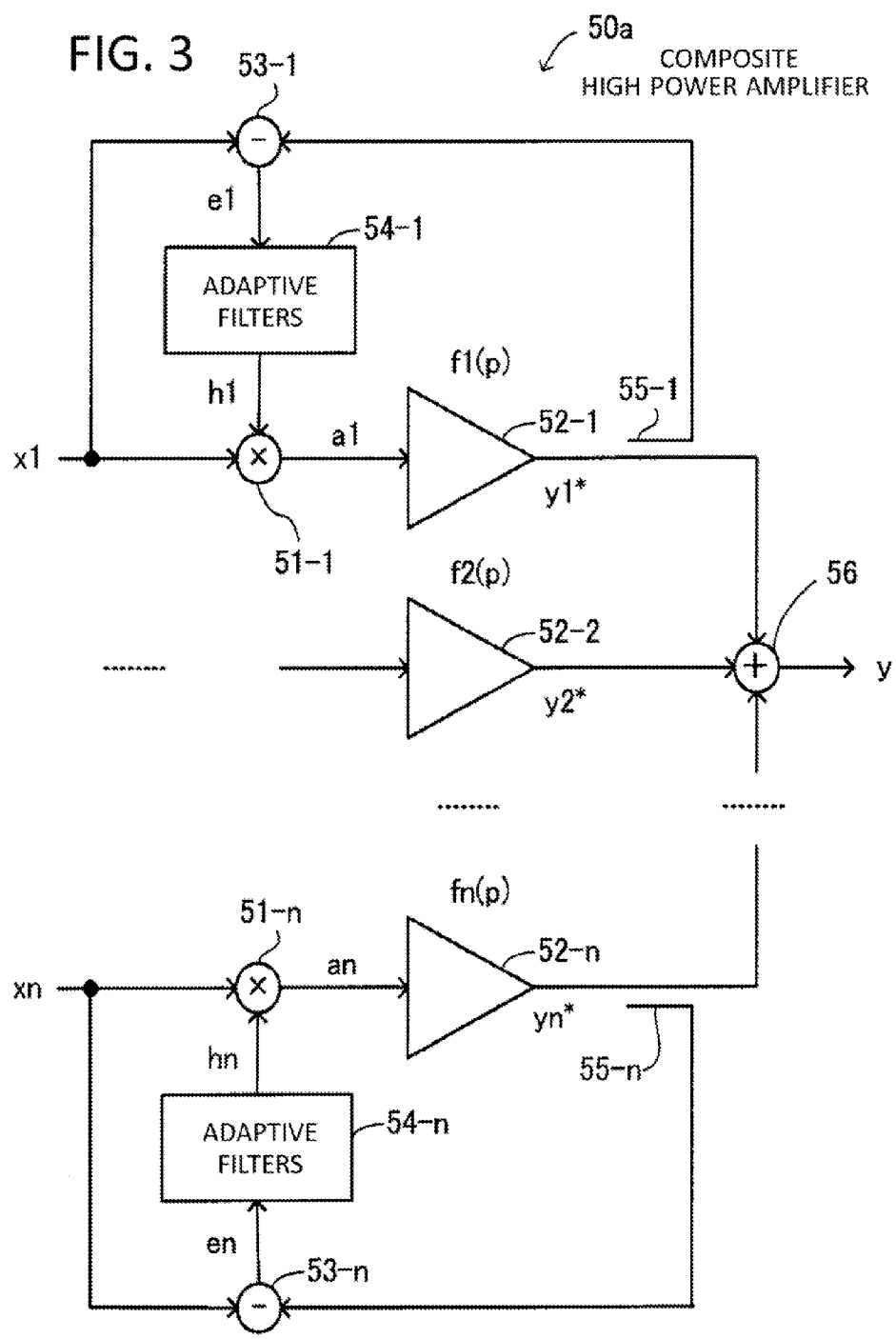
FIG. 3 is a diagram illustrating an exemplary configuration of another composite high power amplifying apparatus.

A configuration of a composite high power amplifier including components that perform digital predistortion to generate correction signals h1 to hn will be described below. FIG. 3 illustrates an exemplary configuration of the composite high power amplifier. The high power amplifier 50a includes multipliers 51-1 to 51-n, high power amplifiers 52-1 to 52-n, subtracters 53-1 to 53-n, adaptive filters 54-1 to 54-n, signal dividers (couplers) 55-1 to 55-n, and an adder 56. It is assumed here that no cross leakage is occurring.

The multiplier 51-1 multiplies an input signal x1 by the correction signal h1 to generate a multiplication signal a1. The high power amplifier 52-1 amplifies the multiplication signal a1 to generate an output signal y1*. The coupler 55-1 divides the output signal y1* into two and outputs one of the two signals to the subtracter 53-1 and the other to the adder 56.

The subtracter 53-1 subtracts the output signal y1* from the input signal x1 to generate an error signal e1 (=x1−y1*). The adaptive filter 54-1 adaptively adjusts a filter coefficient according to an optimization algorithm so that the value of the error signal e1 becomes equal to a predetermined value. The adaptive filter 54-1 outputs a correction signal h1 resulting from filtering.

The multiplier 51-n multiplies an input signal xn by the correction signal hn to generate a multiplication signal an. The high power amplifier 52-n amplifies the multiplication signal an to generate an output signal yn*. The coupler 55-n divides the output signal yn* into two and outputs one of the two signals to the subtracter 53-n and the other to the adder 56.

The subtracter 53-n subtracts the output signal yn* from the input signal xn to generate an error signal en (=xn−yn*). The adaptive filter 54-n adaptively adjusts a filter coefficient according to an optimization algorithm so that the value of the error signal becomes equal to a predetermined value. The adaptive filter 54-n outputs a correction signal hn resulting from filtering.

The adder 56 adds the output signals y1*, y2*, . . . , yn* together to generate and output an ultimate output signal y. The optimization algorithm used in the adaptive filters 54-1 to 54-n may be a least square algorithm such as a least mean square (LMS) algorithm.

To accomplish appropriate digital predistortion for the composite high power amplifier 50a, it is important to use the output signals y1*, y2*, . . . , yn* of the individual high power amplifiers 52-1 to 52-n as described above.

Cross leakage will be described below. The composite high power amplifier 50a includes multiple high power amplifiers 52-1 to 52-n. The outputs of the high power amplifiers 52-1 to 52-n are connected together.

As has been described, the output signals of the high power amplifiers 52-1 to 52-n are divided at their respective couplers 55-1 to 55-n and are then fed back to the adaptive filters 54-1 to 54-n for digital predistortion.

However, the outputs of the high power amplifiers 52-1 to 52-n are not completely isolated from one another inside the composite high power amplifier 50a and the outputs of adjacent high power amplifiers interfere with each other.

Thus, cross leakage occurs in which a signal leaked from the output signal of adjacent one of the high power amplifiers 52-1 to 52-n is superimposed on the output signal of a high power amplifier 52-1 to 52-n. Accordingly, signals fed back from the high power amplifiers 52-1 to 52-n through the couplers 55-1 to 55-n are also affected by cross leakage.

Figure 4:
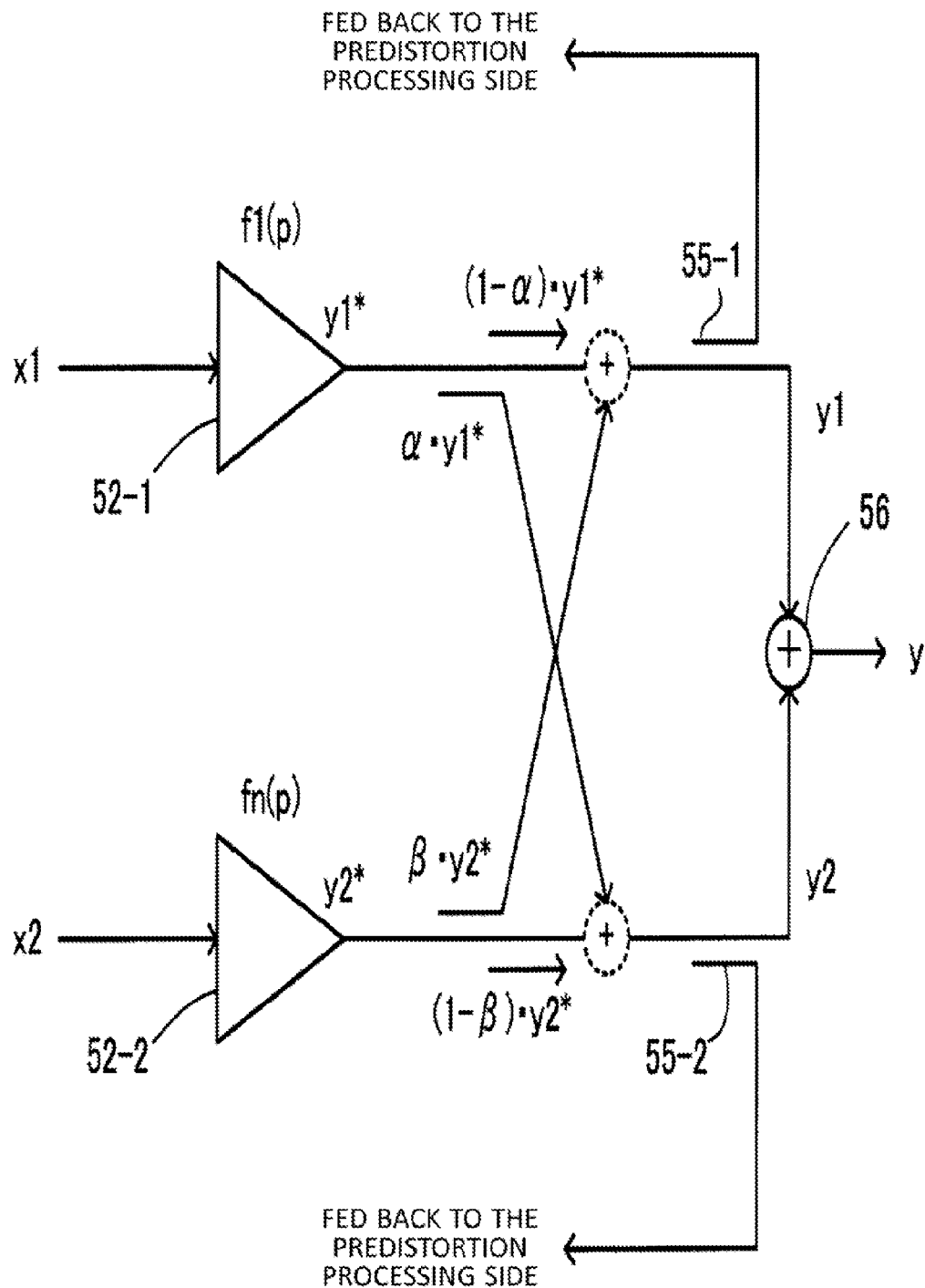
FIG. 4 is a diagram for explaining cross leakage.

FIG. 4 is a model diagram illustrating cross leakage in a composite high power amplifier 50-1 including two high power amplifiers 52-1 and 52-2.

The cross leakage relation in the composite high power amplifier 50-1 may be expressed by Equations (1a) and (1b):

$$y1 = (1-\alpha) \cdot y1^* + \beta \cdot y2^* \quad (1a)$$

$$y2 = (1-\beta) \cdot y2^* + \alpha \cdot y1^* \quad (1b)$$

where y1 is the level value of a signal sent from the high power amplifier 52-1 to the adder 56, y2 is the level value of a signal sent from the high power amplifier 52-2 to the adder 56, and $\alpha$ and $\beta$ are leakage coefficients ($0 \leq \alpha$ and $\beta \leq 1$). The leakage coefficients are dependent on the topology of the internal components of the composite high power amplifier 50-1.

A leakage signal $\alpha \cdot y1^*$ which is the output signal y1* of the high power amplifier 52-1 weighted with the leakage coefficient $\alpha$ leaks to the output of the high power amplifier 52-2. A leakage signal $\beta \cdot y2^*$ which is the output signal y2* of the high power amplifier 52-2 weighted with the leakage coefficient $\beta$ leaks to the output of the high power amplifier 52-1.

Therefore, the signal y1 input into the adder 56 is equal to the combination of the output signal y1* of the high power amplifier 52-1 minus the leakage signal $\alpha \cdot y1^*$, namely $(1-\alpha) \cdot y1^*$, and the leakage signal $\beta \cdot y2^*$ from the high power amplifier 52-2, as shown in Equation (1a).

The other signal y2 input into the adder 56 is equal to the combination of the output signal y2* of the high power amplifier 52-2 minus the leakage signal $\beta \cdot y2^*$, namely $(1-\beta) \cdot y2^*$, and the leakage signal $\alpha \cdot y1^*$ from the high power amplifier 52-1, as shown in Equation (1b).

Thus, the signal fed by the coupler 55-1 back to the predistortion processing side is not the output signal y1* of the high power amplifier 52-1 in fact, but the signal y1 affected by the cross leakage.

Similarly, the signal fed by the coupler 55-2 back to the predistortion processing side is not the output signal y2* of the high power amplifier 52-2 in fact, but the signal y2 affected by the cross leakage.

The output signal y1* (the real level value y1*) of the high power amplifier 52-1 is requested to accomplish accurate digital predistortion for the power amplifier 52-1. However, the signal actually fed back through the coupler 55-1 is the signal y1 containing a leakage signal from the adjacent high power amplifier 52-2 due to cross leakage. Thus, the configuration of the composite high power amplifier 50-1 does not enable accurate predistortion for the high power amplifier 52-1.

The same applies to the high power amplifier 52-2. Specifically, the output signal y2* (the real level value y2*) of the high power amplifier 52-2 is requested to accomplish accurate digital predistortion for the power amplifier 52-2.

However, the signal actually fed back through the coupler 55-2 is the signal y2 containing a signal leaked from the adjacent high power amplifier 52-1 due to cross leakage. Thus, the configuration of the composite high power amplifier 50-1 does not enable accurate predistortion for the high power amplifier 52-2.

As has been described above, in the conventional composite high power amplifiers, output signals from individual high power amplifiers that have been affected by cross leakage are simply fed back through the couplers for performing digital predistortion.

Consequently, errors occur in estimation of correction signals, which degrade the accuracy of linearization performance of digital predistortion. Thus, it has been impossible to implement an efficient composite high power amplifier.

The present technique has been devised in light of these circumstances and provides an amplifying apparatus 1 capable of accurate distortion compensation and efficient amplification and a distortion compensation method for compensating distortion with high accuracy to enable efficient amplification.

The present technique will be described below in detail. A procedure of analysis for deriving a feedback signal used for digital predistortion from a signal affected by cross leakage will be described with respect to a composite power amplifier including two high power amplifiers 52-1 and 52-2 by way of example.

An output signal y1* of the high power amplifier 52-1 and an output signal y2* of the high power amplifier 52-2 are affected by cross leakage. The cross leakage relation is as shown in Equations (1a) and (1b) given earlier.

The sum and difference between Equations (1a) and (1b) are calculated and a linear combination of signals y1 and y2 is performed. The sum $y_+$ and the difference $y_-$ are given by Equations (2a) and (2b):

$$y_+ = y1 + y2 = (1-\alpha) \cdot y1^* + \beta \cdot y2^* + (1-\beta) \cdot y2^* + \alpha \cdot y1^* = y1^* + y2^* \quad (2a)$$

$$y_- = y1 + y2 = (1-\alpha) \cdot y1^* + \beta \cdot y2^* - (1-\beta) \cdot y2^* - \alpha \cdot y1^* = (1-2\alpha) \cdot y1^* - (1-2\beta) \cdot y2 \quad (2a)$$

Here, if $\alpha = \beta$, then Equation (2b) may be written as:

$$y_- = (1-2\alpha)(y1^* y2^*) \quad (2c)$$

Equation (2c) is scaled with $(1-2a)$ and both sides of Equation (2c) are multiplied by $1/(1-2\alpha)$ to obtain Equation (2d).

$$y_-/(1-2\alpha) = y1^* - y2^* \quad (2d)$$

From Equations (2a) and (2b), y1* and y2* may be obtained as given below. Here, y1*a and y2*b are substituted for y1* and y2*.

$$y1^* a = y1^* = (y_+ + y_-/(1-2a))/2 \quad (3a)$$

$$y2^* a = y2^* = (y_+ - y_-/(1-2a))/2 \quad (3b)$$

Matrix expressions will be described below. Equations (1a) and (1b) are rewritten in the form of matrix (Equation (4)).

[Expression 1]

$$\begin{bmatrix} y1 \\ y2 \end{bmatrix} = \begin{bmatrix} (1-\alpha) & \beta \\ \alpha & (1-\beta) \end{bmatrix} \cdot \begin{bmatrix} y1* \\ y2* \end{bmatrix} \quad (4)$$

The 2×2 matrix including the leakage coefficients $\alpha$ and $\beta$ will be referred to as the leakage matrix.

Then, $y_+ = y1 + y2$ in Equation (2a) and $y_- = y1 - y2$ in Equation (2b) are rewritten in the form of matrix (Equation (5)). The 2×2 matrix including matrix elements 1 and −1 in linear combination will be referred to as matrix L.

[Expression 2]

$$\begin{bmatrix} y_+ \\ y_- \end{bmatrix} = \begin{bmatrix} 1 & 1 \\ 1 & -1 \end{bmatrix} \cdot \begin{bmatrix} y1 \\ y2 \end{bmatrix} \quad (5)$$

Substitution of Equation (4) into Equation (5) yields Equation (5a).

[Expression 3]

$$\begin{bmatrix} y_+ \\ y_- \end{bmatrix} = \begin{bmatrix} 1 & 1 \\ 1 & -1 \end{bmatrix} \cdot \begin{bmatrix} (1-\alpha)\beta \\ \alpha(1-\beta) \end{bmatrix} \cdot \begin{bmatrix} y1* \\ y2* \end{bmatrix} \quad (5a)$$

Both sides of Equation (5a) are premultiplied by the inverse matrix of a matrix M which is the multiplication of the leakage matrix and matrix L. The inverse matrix $M^{-1}$ is:

[Expression 4]

$$M^{-1} = \left[ \begin{bmatrix} 1 & 1 \\ 1 & -1 \end{bmatrix} \cdot \begin{bmatrix} (1-\alpha)\beta \\ \alpha(1-\beta) \end{bmatrix} \right]^{-1} \quad (6)$$

It follows that:

[Expression 5]

$$\begin{bmatrix} y1* \\ y2* \end{bmatrix} = \left[ \begin{bmatrix} 1 & 1 \\ 1 & -1 \end{bmatrix} \cdot \begin{bmatrix} (1-\alpha)\beta \\ \alpha(1-\beta) \end{bmatrix} \right]^{-1} \cdot \begin{bmatrix} y_+ \\ y_- \end{bmatrix} \quad (7)$$

Thus, y1* and y2* may be obtained.

Representing the vectors (y1*, y2*, ..., yn*) by Y*, the vectors (y+, y−, ...) by "A", the leakage matrix by "B", and matrix L by "L", a general expression may be written as:

$$Y^* = [L \cdot B]^{-1} \cdot A \quad (8)$$

The unknowns α and β may be estimated according to a commonly-used LMS algorithm based on quality evaluation of digital predistortion, such as ACLR (Adjacent Cannel Leakage Power Ratio), for example.

The inverse matrix of the 2×2 matrix L is Equation (9a). The 3×3 matrix L is Equation (9b) and the inverse matrix of Equation (9b) is Equation (9c).

[Expression 6]

$$L^{-1} = \begin{bmatrix} 0.5 & 0.5 \\ 0.5 & -0.5 \end{bmatrix} \quad (9a)$$

[Expression 7]

$$L = \begin{bmatrix} 1 & 1 & 1 \\ 1 & 1 & -1 \\ 1 & -1 & -1 \end{bmatrix} \quad (9b)$$

[Expression 8]

$$L^{-1} = \begin{bmatrix} 0.5 & 0.0 & 0.5 \\ 0.0 & 0.5 & -0.5 \\ 0.5 & -0.5 & 0.0 \end{bmatrix} \quad (9c)$$

In this way, the signals Y* to be used in digital predistortion may be derived from signals affected by cross leakage. Since the signals y1* and y2* thus obtained are the real level values of the high power amplifiers that have not been affected by cross leakage, accurate digital predistortion may be accomplished.

Figure 5:
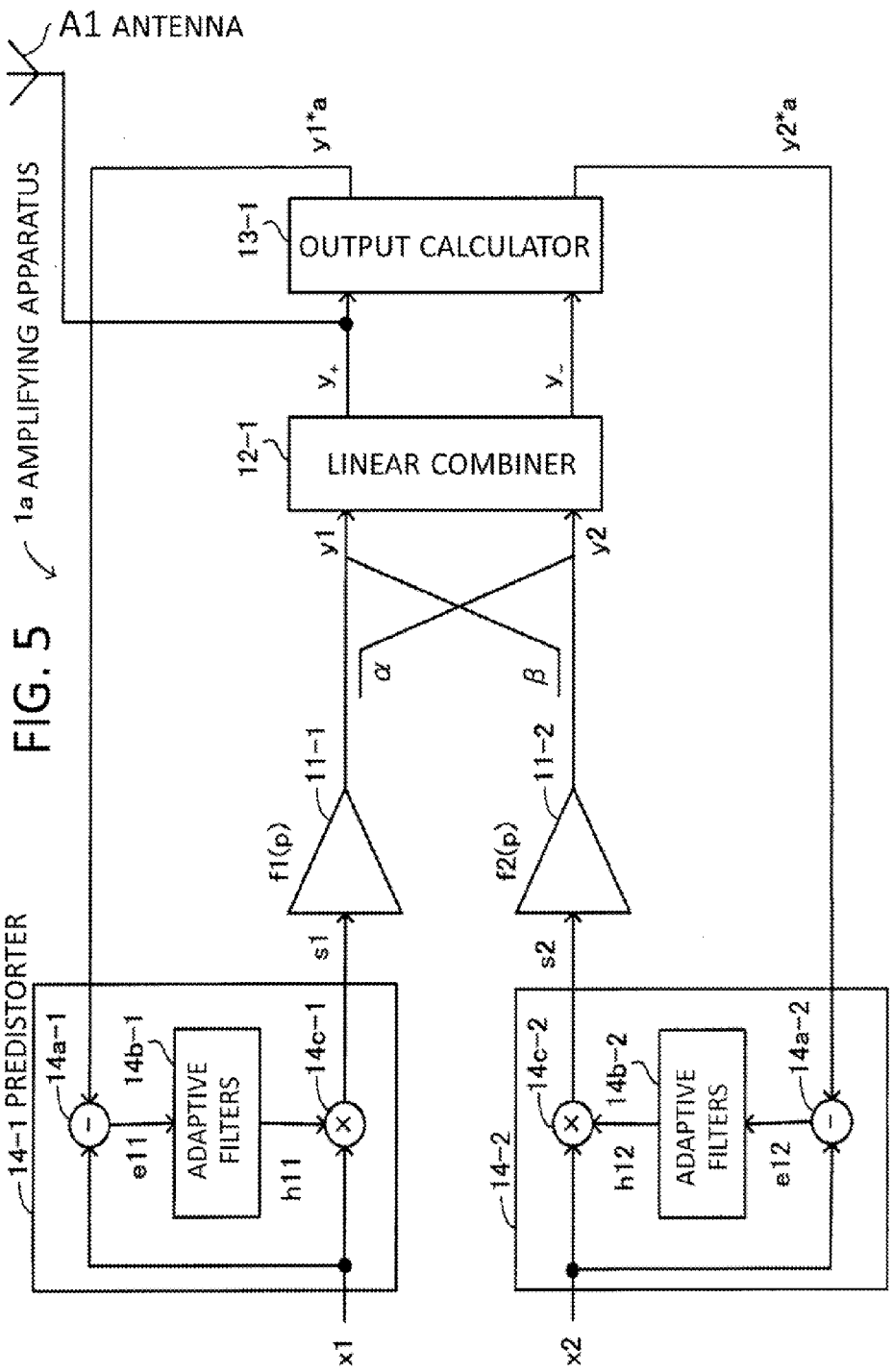
FIG. 5 is a diagram illustrating an exemplary configuration of an amplifying apparatus.

A configuration of an amplifying apparatus having the function of generating a feedback signal obtained by the analysis described above will be described below. FIG. 5 illustrates an exemplary configuration of the amplifying apparatus. The amplifying apparatus 1a includes two high power amplifiers 11-1 and 11-2.

The amplifying apparatus 1a includes high power amplifiers 11-1 and 11-2, a linear combiner 12-1, an output calculator 13-1, predistorters 14-1 and 14-2, and an antenna A1. The high power amplifiers 11-1 and 11-2 amplify predistorted input signals s1 and s2 output from the predistorters 14-1 and 14-2.

The linear combiner 12-1 receives multiple leakage signals y1 and y2 resulting from cross leakage between outputs of the high power amplifiers 11-1 and 11-2. The linear combiner 12-1 then performs the mathematical operation of Equation (5a) as a linear combination of the leakage signals y1 and y2 to generate linear combination signals $y_+$ and $y_-$.

The output calculator 13-1 performs the mathematical operation of Equation (7) on the linear combination signals $y_+$ and $y_-$ to obtain output amplified signals y1*a (=y1*) and y2*a (=y2*) of the high power amplifiers 11-1 and 11-2.

The antenna A1 is attached to the amplifying apparatus 1a provided in the output stage of a wireless communication apparatus, for example, and transmits a linear combination signal $y1_+$ (which is equivalent to an ultimate amplified signal y of the amplifying apparatus 1a) into the air.

The predistorter 14-1 includes a subtracter 14a-1, an adaptive filter 14b-1 and a multiplier 14c-1. The subtracter 14a-1 subtracts the output amplified signal y1*a from an input signal x1 to generate an error signal e11 (=x1−y1*a).

The adaptive filter 14b-1 adaptively adjusts a filter coefficient according to an optimization algorithm so that the value of the error signal becomes equal to a predetermined value, and then generates and outputs a correction signal h11 resulting from filtering. The amplifier 14c-1 multiplies the input signal x1 by the correction signal h11 and inputs the resulting signal s1 into the high power amplifier 11-1.

The predistorter 14-2 includes a subtracter 14a-2, an adaptive filter 14b-2 and a multiplier 14c-2. The subtracter 14a-2 subtracts the output amplified signal y2*a from an input signal x2 to generate an error signal e12 (=x2−y2*a).

The adaptive filter 14b-2 adaptively adjusts a filter coefficient according to an optimization algorithm so that the value of the error signal becomes equal to a predetermined value, and then generates and outputs a correction signal h12 resulting from filtering. The amplifier 14c-2 multiplies the input signal x2 by the correction signal h12 and inputs the resulting signal s2 into the high power amplifier 11-2.

As has been described above, the amplifying apparatus is includes the linear combiner 12-1 generating linear combination signals from leakage signals and the output calculator 13-1 calculating output amplified signals of the high power amplifiers from the linear combination signals.

With the configuration, feedback signals not affected by cross leakage that are to be used in accurate predistortion may be generated. The predistorters 14-1 and 14-2 provided may use the feedback signals not affected by cross leakage to perform digital predistortion. Consequently, accurate predistortion processing may be accomplished.

Figure 6:
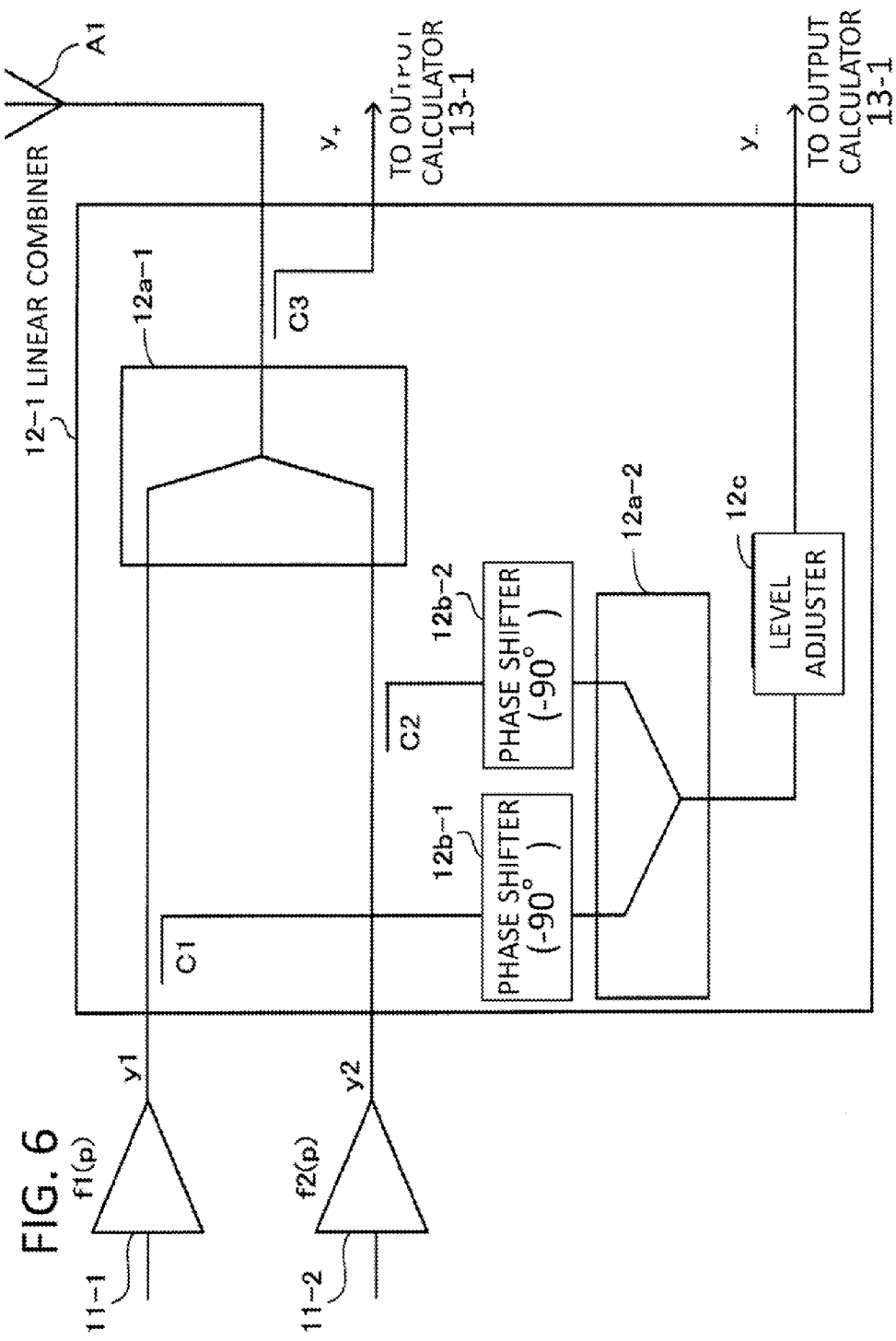
FIG. 6 is a diagram illustrating an exemplary configuration of a linear combiner.

A configuration of the linear combiner 12-1 will be described below. FIG. 6 illustrates an exemplary configuration of the linear combiner 12-1. The linear combiner 12-1 includes combiners 12a-1 and 12a-2, phase shifters 12b-1 and 12b-2, a level adjuster 12c and couplers C1 to C3.

The coupler C1 divides a leakage signal y1 from the high power amplifier 11-1 into two and sends one of the signals to the combiner 12a-1 and the other to the phase shifter 12b-1. The coupler C2 divides a leakage signal y2 from the high power amplifier 11-2 into two and sends one of the signals to the combiner 12a-1 and the other to the phase shifter 12b-2.

The combiner 12a-1 combines the leakage signal y1 from the high power amplifier 11-1 with the leakage signal y2 from the high power amplifier 11-2 to generate a linear combination signal $y_+$. The coupler C3 divides the linear combination signal $y_+$ into two and sends one of the signals to the antenna A1 and the other to the output calculator 13-1. The linear combination signal $y_+$ is an ultimate output of the amplifying apparatus 1 and is transmitted through antenna A1, for example, into the air.

The phase shifter 12b-1 shifts the phase of the leakage signal y1 leaked from the high power amplifier 11-1 by +90 degrees. The phase shift 12b-2 shift the phase of the leakage signal y2 from the high power amplifier 11-2 by −90 degrees.

The combiner 12a-2 combines the signal output from the phase shifter 12b-1 with the signal output from the phase shifter 12b-2. The level adjuster 12c adjusts the level of the signal output from the combiner 12a-2 and sends the adjusted signal to the output calculator 13-1.

Linear combination processing for generating linear combination signals from leakage signals may be accomplished with the simple circuit configuration of the linear combiner 12-1 described above.

Figure 7:
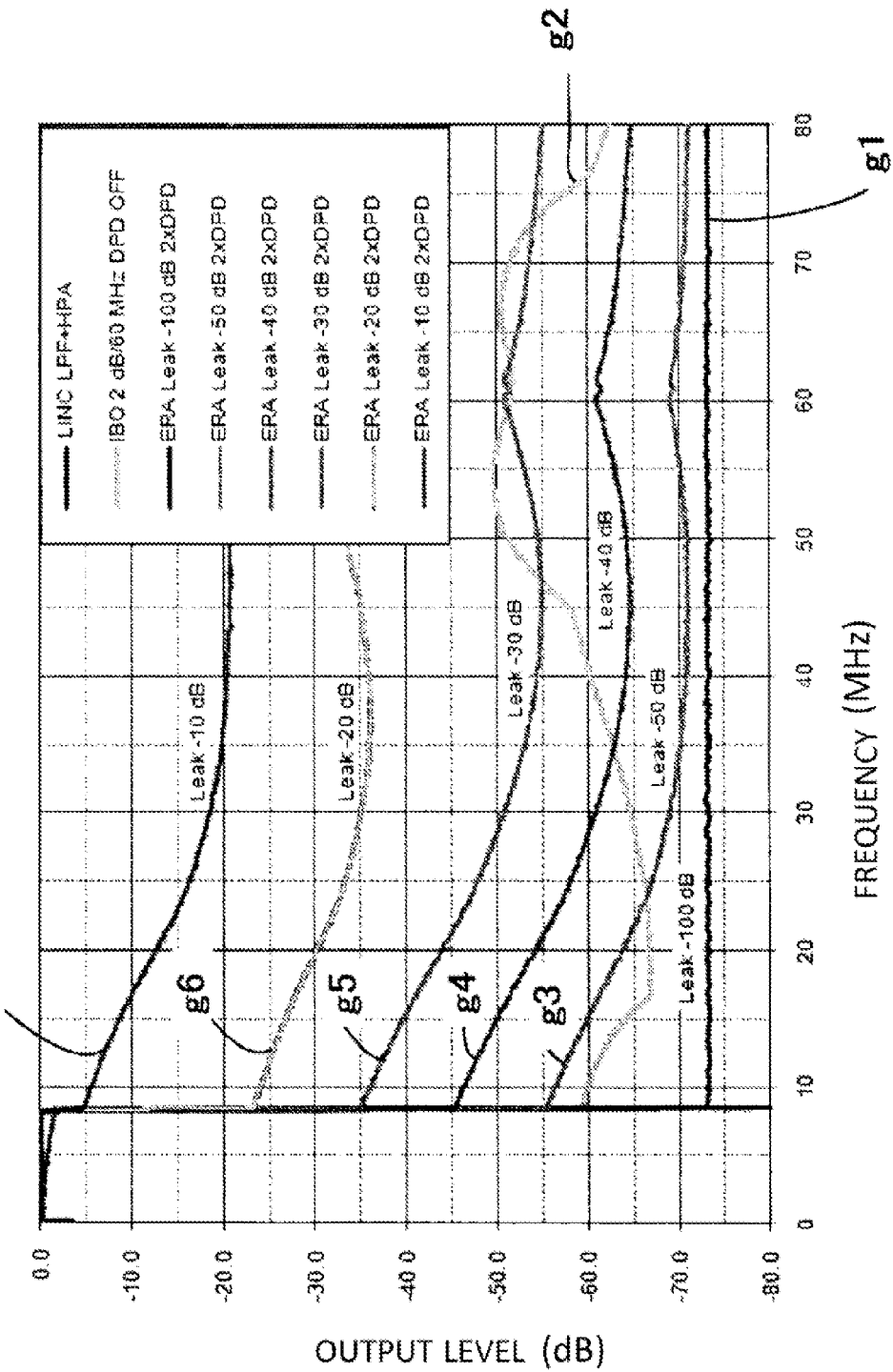
FIG. 7 is a graph of results of performance of digital predistortion.

Results of a simulation of digital predistortion will be described below. FIGS. 7 and 8 are graphs of the results of performance of digital predistortion. The vertical axis of each graph represents the output level of the apparatus (dB) and the horizontal axis represents frequency (MHz). FIG. 7 illustrates variations in the output level of a conventional composite high power amplifier with varying frequencies. FIG. 8 illustrates variations in the output level of an amplifying apparatus using the present technique with varying frequencies.

Curve g1 of FIG. 7 represents an output level (an ideal output level) in the absence of cross leakage. As shown, the output level is substantially constant at varying frequencies. Curve g2 represents an output level without digital predistortion.

Curves g3 to g7 represent output levels in the cases where cross leakage was occurring and digital predistortion was performed using feedback signals affected by the cross leakage, according to a conventional technique. As may be seen from the graph, the output level curves g3 to g7 at varying frequencies deviate from the ideal value and become unlevel as the leakage level increases.

In FIG. 8, curve g1 represents an output level (an ideal output level) in the absence of cross leakage. The output level is substantially constant at varying frequencies. Curve g2 represents the output level without digital predistortion. Curve g0 represents an output level in the case where digital predistortion was performed using the present technique. It may be seen from the graph that the output level g0 in the case where digital predistortion of the present technique substantially agrees with the ideal curve g1.

In the amplifying apparatus 1, as has been described above, a linear combination of the level values of multiple leakage signals resulting from cross leakage of outputs of the high power amplifiers 11-1 to 11-n is performed to generate multiple linear combination signals and the level values of multiple output amplified signals of the high power amplifiers 11-1 to 11-n are obtained from the level values of the linear combination signals.

Since the real level values of the output amplified signals with minimized influence of cross leakage thus obtained are fed back to the predistortion processing side to perform predistortion, accurate distortion compensation may be achieved and therefore efficient signal amplification may be performed.

While exemplary embodiments have been described above, any of the components of the embodiments may be replaced with equivalents having the same functions. Furthermore, any other components and steps may be added to any of the embodiments.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a depicting of the superiority and inferiority of the invention. Although the embodiments of the present invention have been described in detail, it should be understood that the various changes, substitutions, and alterations could be made hereto without departing from the spirit and scope of the invention.

What is claimed is:

1. An amplifying apparatus comprising:
   a plurality of amplifiers;
   a linear combiner configured to receive a plurality of leakage signals resulting from cross leakage between outputs of the plurality of amplifiers and configure to perform a linear combination of level values of the plurality of leakage signals to generate a plurality of linear combination signals;
   an output calculator configured to calculate real level values of a plurality of output amplified signals of the amplifiers from level values of the linear combination signals; and
   a distortion compensator configured to compensate for distortion of outputs of the amplifiers, wherein the distortion compensator generates a correction signal reducing an error between the level value of an input signal input into the amplifiers and the real level value of the output amplified signals to a predetermined value and superimposes the correction signal on the input signal of the amplifiers.

2. An amplifying apparatus comprising:
   a first amplifier;
   a second amplifier;
   a linear combiner configured to receive a first leakage signal from the first amplifier resulting from cross leakage and a second leakage signal from the second amplifier resulting from cross leakage, and configure to perform a linear combination of a level value of the first leakage signal and a level value of the second leakage signal to generate a first linear combination signal and a second combination signal; and an output calculator configured to calculate a real level value of a first output amplified signal of the first amplifier and a real level value of a second output amplified signal of the second amplifier from a level value of the first linear combination signal and a level value of the second linear combination signal, wherein:

the linear combiner generates the first linear combination signal having a level value $y_+$ and the second linear combination signal having a level value $y_-$, the level values $y_+$ and $y_-$ being expressed by a matrix as

[Expression 9]

$$\begin{bmatrix} y_+ \\ y_- \end{bmatrix} = \begin{bmatrix} 1 & 1 \\ 1 & -1 \end{bmatrix} \cdot \begin{bmatrix} (1-\alpha)\beta \\ \alpha(1-\beta) \end{bmatrix} \cdot \begin{bmatrix} y1* \\ y2* \end{bmatrix}$$

where $\alpha$ is a leakage coefficient for the first amplifier, $\beta$ is a leakage coefficient for the second amplifier, $y1*$ is a real level value of the first output amplified signal, and $y2*$ is a real level value of the second output amplified signal.

3. The amplifying apparatus according to claim 2, wherein: the output calculator premultiplies both sides of the matrix equation

[Expression 9]

$$\begin{bmatrix} y_+ \\ y_- \end{bmatrix} = \begin{bmatrix} 1 & 1 \\ 1 & -1 \end{bmatrix} \cdot \begin{bmatrix} (1-\alpha)\beta \\ \alpha(1-\beta) \end{bmatrix} \cdot \begin{bmatrix} y1* \\ y2* \end{bmatrix}$$

by an inverse matrix of the matrix

[Expression 10]

$$M^{-1} = \left[ \begin{bmatrix} 1 & 1 \\ 1 & -1 \end{bmatrix} \cdot \begin{bmatrix} (1-\alpha)\beta \\ \alpha(1-\beta) \end{bmatrix} \right]^{-1}$$

to obtain the real level value $y1*$ of the first output amplified signal and the real level value $y2*$ of the second output amplified signal expressed by

[Expression 11]

$$\begin{bmatrix} y1* \\ y2* \end{bmatrix} = \left[ \begin{bmatrix} 1 & 1 \\ 1 & -1 \end{bmatrix} \cdot \begin{bmatrix} (1-\alpha)\beta \\ \alpha(1-\beta) \end{bmatrix} \right]^{-1} \cdot \begin{bmatrix} y_+ \\ y_- \end{bmatrix}$$

4. The amplifying apparatus according to claim 2, further comprising a first distortion compensator configured to compensate for distortion of an output of the first amplifier and a second distortion compensator compensating for distortion of an output of the second amplifier;

wherein:

the first distortion compensator generates a first correction signal reducing an error between a level value of an input signal input into the first amplifier and the real level value of the first output amplified signal to a predetermined value and superimposes the first correction signal on the input signal of the first amplifier; and the second distortion compensator generates a second correction signal reducing an error between a level value of an input signal input into the second amplifier and the real level value of the second output amplified signal to a predetermined value and superimposes the second correction signal on the input signal of the second amplifier.

5. The amplifying apparatus according to claim 4, wherein the linear combiner comprises:

a first combiner combining the first leakage signal with the second leakage signal to generate the first linear combination signal;

a first phase shifter shifting the phase of the first leakage signal by +90 degrees;

a second phase shifter shifting the phase of the second leakage signal by −90 degrees; and a second combiner combining an output signal from the first phase shifter with an output signal from the second phase shifter to generate the second linear combination signal.

6. A distortion compensation method, comprising:

performing a linear combination of level values of a plurality of leakage signals resulting from cross leakage between outputs of a plurality of amplifiers to generate a plurality of linear combination signals;

calculating real level values of a plurality of output amplified signals of the amplifiers from level values of the linear combination signals;

generating a correction signal reducing an error between the level value of an input signal input into the amplifiers and the real level value of the output amplified signals to a predetermined value;

superimposing the correction signal on the input signals of the amplifiers to compensate for distortion of the outputs of the amplifiers; and compensating for distortion of outputs of the amplifiers, wherein a distortion compensator generates a correction signal reducing an error between the level value of an input signal input into the amplifiers and the real level value of the output amplified signals to a predetermined value and superimposes the correction signal on the input signal of the amplifiers.

* * * * *